United States Patent
Bandiera

(10) Patent No.: US 10,712,399 B2
(45) Date of Patent: Jul. 14, 2020

(54) MLU CELL FOR SENSING AN EXTERNAL MAGNETIC FIELD AND A MAGNETIC SENSOR DEVICE COMPRISING THE MLU CELL

(71) Applicant: CROCUS Technology SA, Grenoble (FR)

(72) Inventor: Sebastien Bandiera

(*) Notice: Subject to any disclaimer, the term of this patent is extended or adjusted under 35 U.S.C. 154(b) by 319 days.

(21) Appl. No.: 15/527,766

(22) PCT Filed: Nov. 18, 2015

(86) PCT No.: PCT/EP2015/077004
§ 371 (c)(1),
(2) Date: May 18, 2017

(87) PCT Pub. No.: WO2016/079201
PCT Pub. Date: May 26, 2016

(65) Prior Publication Data
US 2017/0322263 A1    Nov. 9, 2017

(30) Foreign Application Priority Data
Nov. 19, 2014    (EP) .................................... 14290351

(51) Int. Cl.
*G01R 33/00*    (2006.01)
*G01R 33/09*    (2006.01)

(52) U.S. Cl.
CPC ....... *G01R 33/0017* (2013.01); *G01R 33/098* (2013.01)

(58) Field of Classification Search
CPC ..... G01R 33/00; G01R 33/09; G01R 33/0017
See application file for complete search history.

(56) References Cited

U.S. PATENT DOCUMENTS 6,275,363 B1    8/2001    Gill
7,598,555 B1 *  10/2009   Papworth Parkin .... H01L 43/08
                                                257/295
(Continued)

FOREIGN PATENT DOCUMENTS

EP    2597692 A1    5/2013
EP    2712079 A1    3/2014

OTHER PUBLICATIONS

International Search Report for PCT/EP2015/077004 dated Jan. 25, 2016.
Written Opinion for PCT/EP2015/077004 dated Jan. 25, 2016.

*Primary Examiner* — Alvaro E Fortich
(74) *Attorney, Agent, or Firm* — Pearne & Gordon LLP

(57) ABSTRACT

A MLU cell for sensing an external magnetic field, including a magnetic tunnel junction including a sense layer having a sense magnetization adapted to be oriented by the external magnetic field; a reference layer having a reference magnetization; a tunnel barrier layer; a biasing layer having a biasing magnetization and a biasing antiferromagnetic layer pinning the biasing magnetization substantially parallel to the pinned reference magnetization at a low threshold temperature and freeing it at a high threshold temperature. A biasing coupling layer is between the sense layer and the basing layer and configured for magnetically coupling the biasing layer and the sense layer such that the sense magnetization is oriented substantially perpendicular to the pinned biasing magnetization and to the pinned reference magnetization. The present disclosure further concerns a magnetic sensor device for sensing an external magnetic field, including a plurality of the MLU cells.

18 Claims, 4 Drawing Sheets

(56) References Cited

U.S. PATENT DOCUMENTS

| | | | |
|---|---|---|---|
| 2003/0184918 A1 | 10/2003 | Lin et al. | |
| 2004/0104724 A1* | 6/2004 | Sato | B82Y 25/00 324/224 |
| 2006/0044707 A1* | 3/2006 | Araki | B82Y 10/00 360/324.12 |
| 2006/0094129 A1* | 5/2006 | Pinarbasi | B82Y 25/00 438/3 |
| 2006/0098354 A1* | 5/2006 | Parkin | B82Y 10/00 360/324.2 |
| 2006/0202244 A1 | 9/2006 | Ju et al. | |
| 2006/0238925 A1 | 10/2006 | Wang et al. | |
| 2007/0183190 A1* | 8/2007 | Eyckmans | B82Y 25/00 365/173 |
| 2008/0062581 A1* | 3/2008 | Parkin | B82Y 10/00 360/324.11 |
| 2009/0122597 A1* | 5/2009 | Sugibayashi | B82Y 10/00 365/158 |
| 2009/0135529 A1* | 5/2009 | Shimazawa | B82Y 10/00 360/319 |
| 2010/0020447 A1 | 1/2010 | Hawraneck | |
| 2011/0292718 A1* | 12/2011 | Suzuki | G11C 11/16 365/158 |
| 2012/0155155 A1* | 6/2012 | Katti | G11C 11/16 365/158 |
| 2012/0250404 A1* | 10/2012 | Wang | G11C 11/161 365/171 |
| 2014/0219012 A1* | 8/2014 | Manipatruni | H03K 19/16 365/158 |
| 2014/0248719 A1* | 9/2014 | Zhou | G11C 11/161 438/3 |
| 2014/0268428 A1* | 9/2014 | Dimitrov | G11B 5/3912 360/313 |
| 2015/0063019 A1* | 3/2015 | Dieny | G11C 11/15 365/158 |
| 2015/0200003 A1* | 7/2015 | Buhrman | G11C 11/18 365/158 |
| 2015/0228888 A1* | 8/2015 | Prejbeanu | H03F 15/00 330/62 |

* cited by examiner

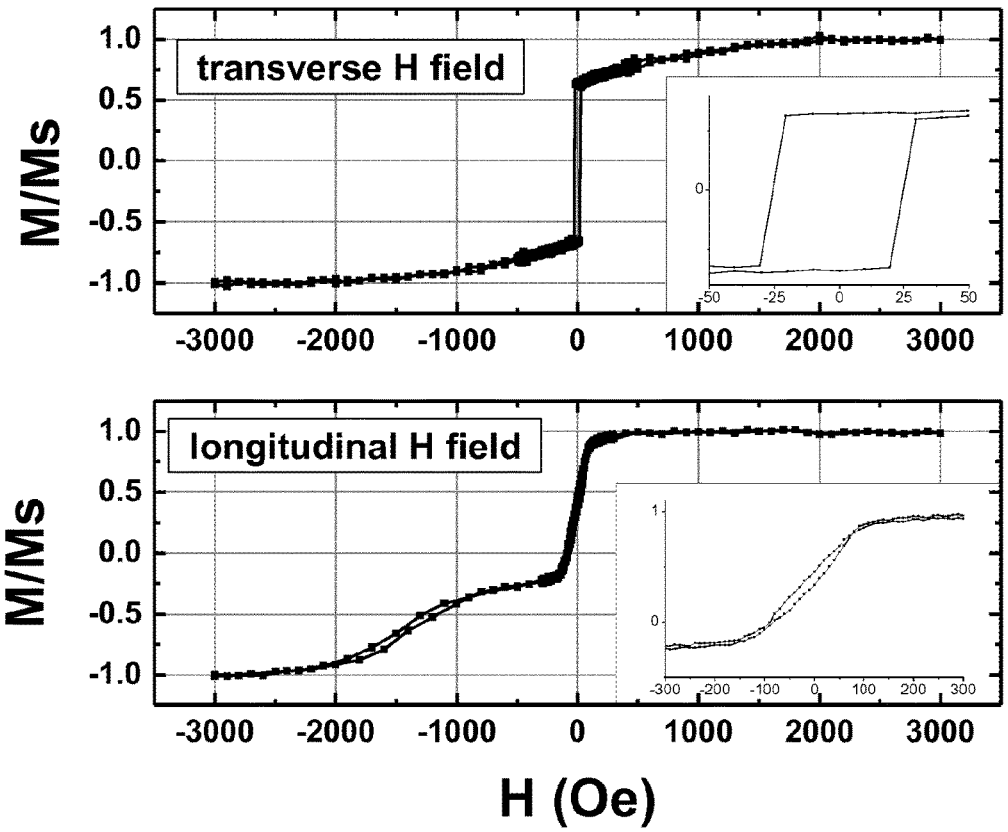
Fig. 7(a)
Fig. 7(b)
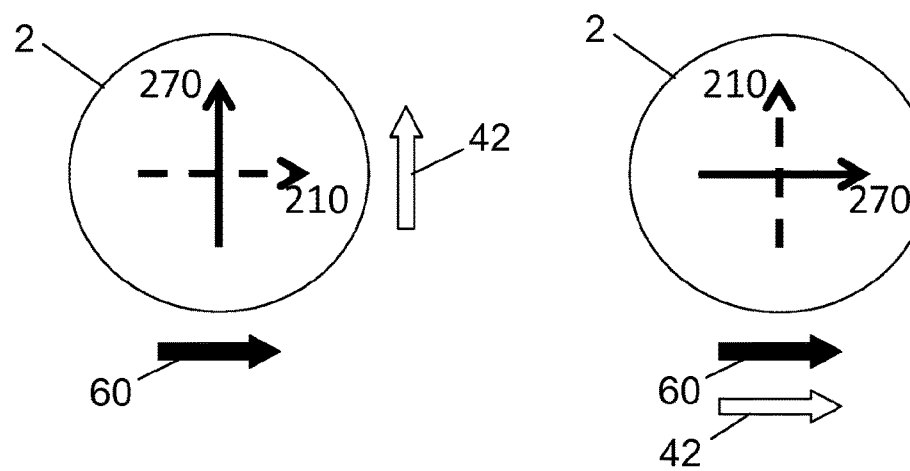
Fig. 8(a)          Fig. 8(b)

MLU CELL FOR SENSING AN EXTERNAL MAGNETIC FIELD AND A MAGNETIC SENSOR DEVICE COMPRISING THE MLU CELL

FIELD OF THE INVENTION

The present invention concerns MLU cell for sensing an external magnetic field and a magnetic sensor device comprising the MLU cell. The MLU cell magnetic sensor device yield a linear signal when measuring the external magnetic field.

DESCRIPTION OF RELATED ART

Magnetic logic unit (MLU) cells can be used to sense magnetic fields, in magnetic sensors or compasses. A MLU cell can comprise a magnetic tunnel junction including a reference layer having a fixed reference magnetization, a sense layer having a free sense magnetization and a tunnel barrier layer between the reference and sense layers. The sense magnetization is orientable in the presence of the external magnetic field while the reference magnetization remains undisturbed by the external magnetic field. The external magnetic field can thus be sensed by measuring a resistance of the magnetic tunnel junction that depends on the relative orientation of the sense magnetization, oriented by the external magnetic field, and the fixed reference magnetization.

Ideally, the sense layer has a linear and non-hysteretic behavior when oriented by the external magnetic field in order to facilitate the measurement of small variations of the external magnetic field. That is relevant when sensing the earth's magnetic field having an average value on the order of 0.5 Oersted (Oe).

Such linear and non-hysteretic behavior can be achieved by providing a magnetic tunnel junction where the sense magnetization is oriented substantially perpendicular to the reference magnetization. This is usually achieved by pinning the reference magnetization perpendicular to an anisotropy axis of the sense layer. The orientation of the anisotropy axis of the sense layer can be defined by sputtering conditions, for example by applying a magnetic field, during the manufacturing of the magnetic tunnel junction.

A drawback of the above MLU cell is that, when the sense layer comprises a single ferromagnetic layer, only one direction of anisotropy can be defined by the sputter conditions on a wafer comprising a plurality of MRAM cells.

FIG. 1 illustrates a conventional MLU-based device 100 including a plurality of MLU cells electrically connected in series to a current line 3. A magnetic sensor usually requires at least two directions of sensing. FIG. 3 shows a conventional MLU cell comprising a magnetic tunnel junction 2 including a sense layer 21 having a sense magnetization 210, a reference layer 23 having a reference magnetization 230, a reference antiferromagnetic layer 24 pinning the reference magnetization 230 at a low threshold temperature and freeing it at a high threshold temperature, and a tunnel barrier layer 22. The sense magnetization 210 is configured to be orientable in an external magnetic field such that a resistance of the magnetic tunnel junction 2, determined by the relative orientation of the sense magnetization 210 and reference magnetization 230, is varied.

Referring back to FIG. 1, the plurality of MLU cells is represented by the dotted patterns 101, 102, 103. A field line 4 is configured to generate a magnetic field based on an input (a field current). In particular, the plurality of MLU cells are configured in branches 101, 102, 103, each comprising a subset of MLU cells. These branches are oriented at angles of about 0°, about 45°, about 90°, relative to an axis x. The field line may include a plurality of portions 401, 402, 403, each disposed adjacent to a corresponding one of the branches 101, 102, 103 of MLU cells, respectively. The field line portions 401, 402, 403 are configured such that a direction of current flow 41 through each of the portions 401, 402, 403 have an angular orientation corresponding to an angular orientation of its corresponding branches 101, 102, 103. As a result, a programming magnetic field (shown by the dotted arrow 42 in FIG. 1) is oriented in a direction perpendicular to the respective field line portion 401, 402, 403 and align the reference magnetization in the same direction (dashed arrow 230). The sense magnetization direction (shown by the plain arrow 210 in FIG. 1) is oriented in accordance with the anisotropy axis that is defined by the sputter conditions. In FIG. 1, the sense magnetization 210 is oriented perpendicular to the reference magnetization 230 in the branches 101 at about 0°, at an angle of about 45° in the subset 102 at about 45°, and substantially parallel to the reference magnetization 230 in the subset 103 at about 90°.

FIGS. 2a to 2c show hysteresis loops corresponding to the first branch 101 (FIG. 2a), second branch 102 (FIG. 2b) and third branch 103 (FIG. 2c). In the first branch 101, the resistance R varies linearly with a change in magnetic field H that due to the variation in orientation of the sense magnetization 210 around its anisotropy axis being perpendicular to the orientation of the reference magnetization 230. In the second and third branches 102, 103 the resistance R does not vary linearly with a change in magnetic field H.

Document US2006202244 discloses a MRAM having two memory cells, each memory cell having an associated biasing layer. Each biasing layer reduces the switching field of its associated cell by applying a biasing field along the hard-axis of magnetization of the free layer of its associated cell. The free layers in the two cells in each stack have their in-plane easy axes of magnetization aligned parallel to one another.

Document US2010020447 describes a system including a sense layer, a first pinned layer and a first interlayer. The first interlayer is configured to couple the sense layer and the first pinned layer and provide a magnetic orientation in the sense layer that is 90° from the fixed magnetic orientation. The magnetic orientation in the sense layer rotates in response to an external magnetic field.

Document US2006238925 concerns a magnetoresistive structure using twisted coupling to induce a perpendicular magnetization alignment between the free layer and the pinned layer.

Document US2006044707 relates to a magnetoresistive sensor having an in stack bias structure. The sensor includes a bias spacer that allows biasing of free layer magnetic moment in a direction orthogonal to the magnetic moment of the biasing layer.

Document US2003184918 discloses a dual spin valve sensor with a longitudinal bias stack sandwiched between a first SV stack and a second SV stack. The first and second SV stacks comprise antiparallel (AP)-pinned layers pinned by AFM layers made of an AFM material having a higher blocking temperature than the AFM material of the bias stack allowing the AP-pinned layers to be pinned in a transverse direction and the bias stack to be pinned in a longitudinal direction. The demagnetizing fields of the two AP-pinned layers cancel each other and the bias stack provides flux closures for the sense layers of the first and second SV stacks.

Document U.S. Pat. No. 6,275,363 concerns a dual tunnel junction sensor which has an antiparallel (AP) coupled free layer structure which optimizes in-phase scattering of conduction electrons and response to signal fields. The sensor has a total number of ferromagnetic layers which assures that magnetic moments between the AP coupled free layer structure and pinned layer structures on each side of the free layer structure are in phase for adding the resistance changes on each side of the free layer structure due to the in-phase scattering of conduction electrons.

SUMMARY

The present disclosure concerns a MLU cell for sensing an external magnetic field, comprising a magnetic tunnel junction including a sense layer having a sense magnetization adapted to be oriented by the external magnetic field; a reference layer having a reference magnetization; and a tunnel barrier layer; a biasing layer having a biasing magnetization and a biasing antiferromagnetic layer pinning the biasing magnetization at a low threshold temperature and freeing the biasing magnetization at a high threshold temperature; the pinned biasing magnetization being oriented substantially parallel to the pinned reference magnetization; a biasing coupling layer between the sense layer and the basing layer, the biasing coupling layer comprising a magnetic material of the antiferromagnetic type and being configured for magnetically coupling the biasing layer and the sense layer such that the sense magnetization is oriented substantially perpendicular to the pinned biasing magnetization and to the pinned reference magnetization; the magnetic tunnel junction further comprising a non-magnetic spacer layer between the sense layer and the biasing coupling layer, the non-magnetic spacer layer comprising one of: Ta, Mg, Al, Ru, Cu, Pt, Pd, Hf, Cr, Nb, Zn or any alloy or oxide containing any one of these elements, and being configured for tuning the strength of the magnetic coupling of the coupling layer.

The present disclosure further concerns a magnetic sensor device for sensing an external magnetic field, comprising a plurality of branches, each branch comprising a subset of a plurality of MLU cells.

The present disclosure also pertains to a method for programming the magnetic sensor device.

BRIEF DESCRIPTION OF THE DRAWINGS

The invention will be better understood with the aid of the description of an embodiment given by way of example and illustrated by the figures, in which:

FIGS. 7a and 7b represent hysteresis loops measured on an MLU cell with a transverse magnetic field (FIG. 7a) and a longitudinal magnetic field (FIG. 7b);

FIGS. 8a and 8b show a top view of the magnetic tunnel junction with the directions of the sense and biasing magnetizations, for an applied transverse magnetic field (FIG. 8a) and an applied longitudinal magnetic field (FIG. 8b)

DETAILED DESCRIPTION OF POSSIBLE EMBODIMENTS

Figure 4:
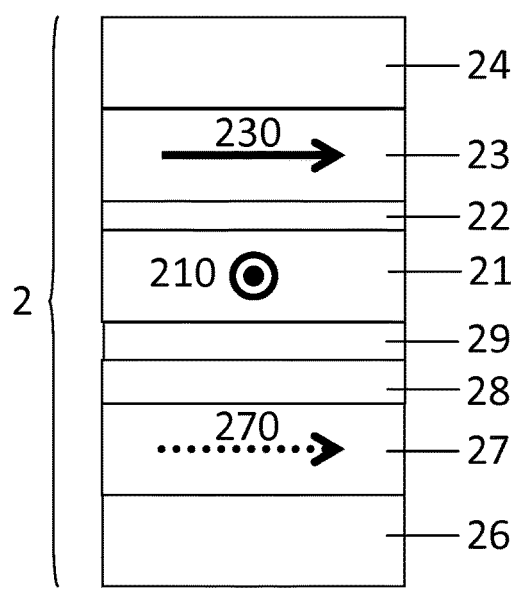
FIG. 4 shows a MLU cell for sensing an external magnetic field, according to an embodiment.

FIG. 4 shows a MLU cell 1 for sensing an external magnetic field, according to an embodiment. The MLU cell 1 comprises a magnetic tunnel junction 2 including a sense layer 21 having a sense magnetization 210 adapted to be oriented by the external magnetic field, a reference layer 23 having a reference magnetization 230, and a tunnel barrier layer 22 between the sense layer 21 and the reference layer 23.

The sense layer 21 can include a soft ferromagnetic material, namely one having a relatively low coercivity, while the reference layer 23 can include a hard ferromagnetic material, namely one having a relatively high coercivity. Suitable ferromagnetic materials include transition metals, rare earth elements, and their alloys, either with or without main group elements. For example, suitable ferromagnetic materials include iron ("Fe"), cobalt ("Co"), nickel ("Ni"), and their alloys, such as permalloy (or Ni80Fe20); alloys based on Ni, Fe, and boron ("B"); Co90Fe10; and alloys based on Co, Fe, and B. A thickness of each of the sense layer 21 and the reference layer 23 can be in the nm range, such as from about 0.4 nm to about 20 nm or from about 1 nm to about 10 nm. Other implementations of the sense layer 21 and the storage layer 23 are contemplated. For example, either, or both, of the sense layer 21 and the storage layer 23 can include multiple sub-layers in a fashion similar to that of the so-called synthetic antiferromagnetic layer.

The tunnel barrier layer 22 can include, or can be formed of, an insulating material. Suitable insulating materials include oxides, such as aluminum oxide (e.g., $Al_2O_3$) and magnesium oxide (e.g., MgO). A thickness of the tunnel barrier layer 22 can be in the nm range, such as from about 0.5 nm to about 10 nm.

Referring to FIG. 4, the MLU cell 1 also includes a reference pinning layer 24, or pinning layer, which is disposed adjacent to the reference layer 23 and, through exchange bias, stabilizes, or pin, the reference magnetization 230 along a particular direction when a temperature within, or in the vicinity of, the reference pinning layer 24 is at a low threshold temperature $T_L$. The low threshold temperature $T_L$ can correspond to a temperature being below a blocking temperature, a Neel temperature, or another threshold temperature. The reference pinning layer 24 unpins, or decouples, the reference magnetization 230 when the temperature is at high threshold temperature $T_H$, i.e., at a temperature above the blocking temperature, thereby allowing the reference magnetization 230 to be switched to another direction.

In one embodiment, such a pinning layer 24 is omitted adjacent to the sense layer 21, and, as a result, the sense layer 21 has a sense magnetization 210 that is unpinned and is readily varied, with the substantial absence of exchange bias.

The reference pinning layer 24 includes, or is formed of, a magnetic material and, in particular, a magnetic material of the antiferromagnetic type. Suitable antiferromagnetic materials include transition metals and their alloys. For example, suitable antiferromagnetic materials include alloys based on manganese ("Mn"), such as alloys based on iridium ("Ir") and Mn (e.g., IrMn); alloys based on Fe and Mn (e.g., FeMn); alloys based on platinum ("Pt") and Mn (e.g., PtMn); and alloys based on Ni and Mn (e.g., NiMn). In some instances, the blocking temperature of alloys based on Ir and Mn (or based on Fe and Mn) can be in the range of about 90° C. to about 350° C. or about 150° C. to about 200° C., and can be smaller than the blocking temperature of alloys based on Pt and Mn (or based on Ni and Mn), which can be in the range of about 200° C. to about 400° C.

The MLU cell 1 further includes a biasing layer 27 having a biasing magnetization 270. The biasing layer 27 can comprise, or be formed of, a ferromagnetic material based on Co, Ni or Fe, such as CoFe, NiFe or CoFeB.

The MLU cell 1 further includes a biasing pinning layer 26 which is disposed adjacent to the biasing layer 27 and, through exchange bias, stabilizes, or pin, the biasing magnetization 270 along a particular direction when a temperature within, or in the vicinity of, the biasing pinning layer 26 is at a low threshold temperature $T_{LP}$ of the biasing pinning layer 26. The biasing pinning layer 26 unpins, or decouples, the biasing magnetization 270 when the temperature is at a high threshold temperature $T_{HP}$ of the biasing pinning layer 26, thereby allowing the biasing magnetization 270 to be switched to another direction.

The biasing pinning layer 26 comprises, or is formed of, a magnetic material and, in particular, a magnetic material of the antiferromagnetic type, including alloys based on manganese ("Mn"), such as alloys based on iridium ("Ir") and Mn (e.g., IrMn); alloys based on Fe and Mn (e.g., FeMn); alloys based on platinum ("Pt") and Mn (e.g., PtMn); and alloys based on Ni and Mn (e.g., NiMn). In a preferred embodiment, the biasing pinning layer 26 includes, or is formed of, the same antiferromagnetic material as the one included, or forming, the reference pinning layer 24. In the latter configuration, the low and high threshold temperatures $T_{LP}$, $T_{HP}$ of the biasing pinning layer 26 are substantially the same as the low and high threshold temperatures $T_L$, $T_H$ of the reference pinning layer 24.

The MLU cell 1 further comprises a biasing coupling layer 28 between the sense layer 21 and the basing layer 27. The biasing coupling layer 28 is configured to magnetically couple the biasing layer 27 and the sense layer 21 such that the sense magnetization 210 is oriented substantially perpendicular to the biasing magnetization 270.

The biasing coupling layer 28 comprises, or is formed of, a magnetic material of the antiferromagnetic type, including alloys based on manganese ("Mn"), such as alloys based on iridium ("Ir") and Mn (e.g., IrMn); alloys based on Fe and Mn (e.g., FeMn); alloys based on platinum ("Pt") and Mn (e.g., PtMn); and alloys based on Ni and/or Co, such as NiO or CoO, or O based antiferromagnetic material such as CoFeO, NiFeO, or any Co, Fe, Ni or Mn based antiferromagnetic material.

The reference magnetization 230, the sense magnetization 210 and the biasing magnetization 270 are orientable in the plane of the reference layer 23, sense layer 21 biasing layer 27, respectively.

Figure 5:
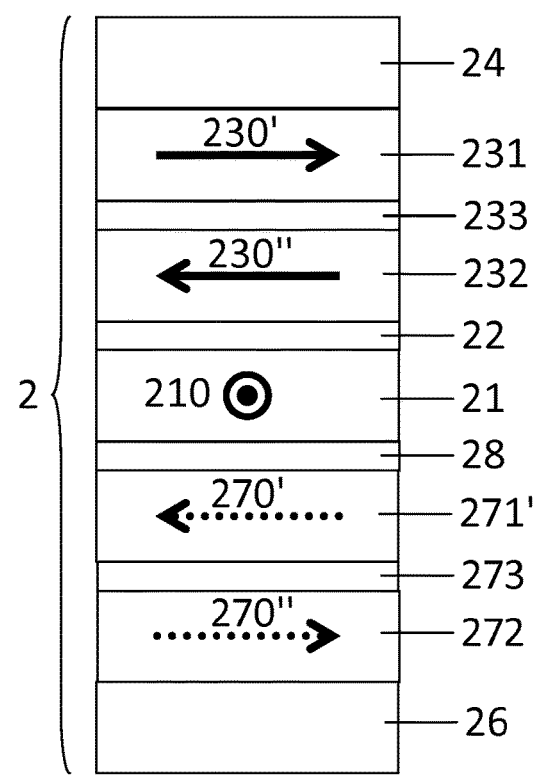
FIG. 5 illustrates a MLU cell for sensing an external magnetic field, according to another embodiment.

In a variant illustrated in FIG. 5, the biasing layer 27 is a synthetic ferromagnetic layer comprising a first biasing ferromagnetic layer 271 having a first basing magnetization 270' and a second basing ferromagnetic layer 272 having a second basing magnetization 270". A biasing spacer layer 273 antiferromagnetically couples (for example via s RKKY interaction) the first and second biasing ferromagnetic layers 271, 272. As illustrated in FIG. 5, the sense layer 21 can also be a synthetic ferromagnetic layer comprising a first reference ferromagnetic layer 231 having a first reference magnetization 230' and a second reference ferromagnetic layer 232 having a second reference magnetization 230". A reference spacer layer 233 antiferromagnetically couples (for example via s RKKY interaction) the first and second reference ferromagnetic layers 231, 232. The reference spacer layer 233 and/or the basing spacer layer 273 can be made of Ru.

In an embodiment, the MLU cell 1 further comprises a non-magnetic spacer layer 29 between the sense layer 21 and the coupling layer 28. The non-magnetic spacer layer 29, deposited in the vicinity of the biasing coupling layer 28, can be used to tune the strength of the magnetic coupling of the coupling layer 28. This tuning is possible by adjusting the thickness of the non-magnetic spacer 29. The non-magnetic spacer layer 29 comprises, or is formed of, Ta, Mg, Al, Ru, Cu, Pt, Pd, Hf, Cr, Nb, Zn or any alloy or oxide containing any one of these elements and have a thickness that is equal or smaller than about 2 nm.

The pinned biasing magnetization 270 is oriented substantially parallel to the pinned reference magnetization 230.

Figure 1:
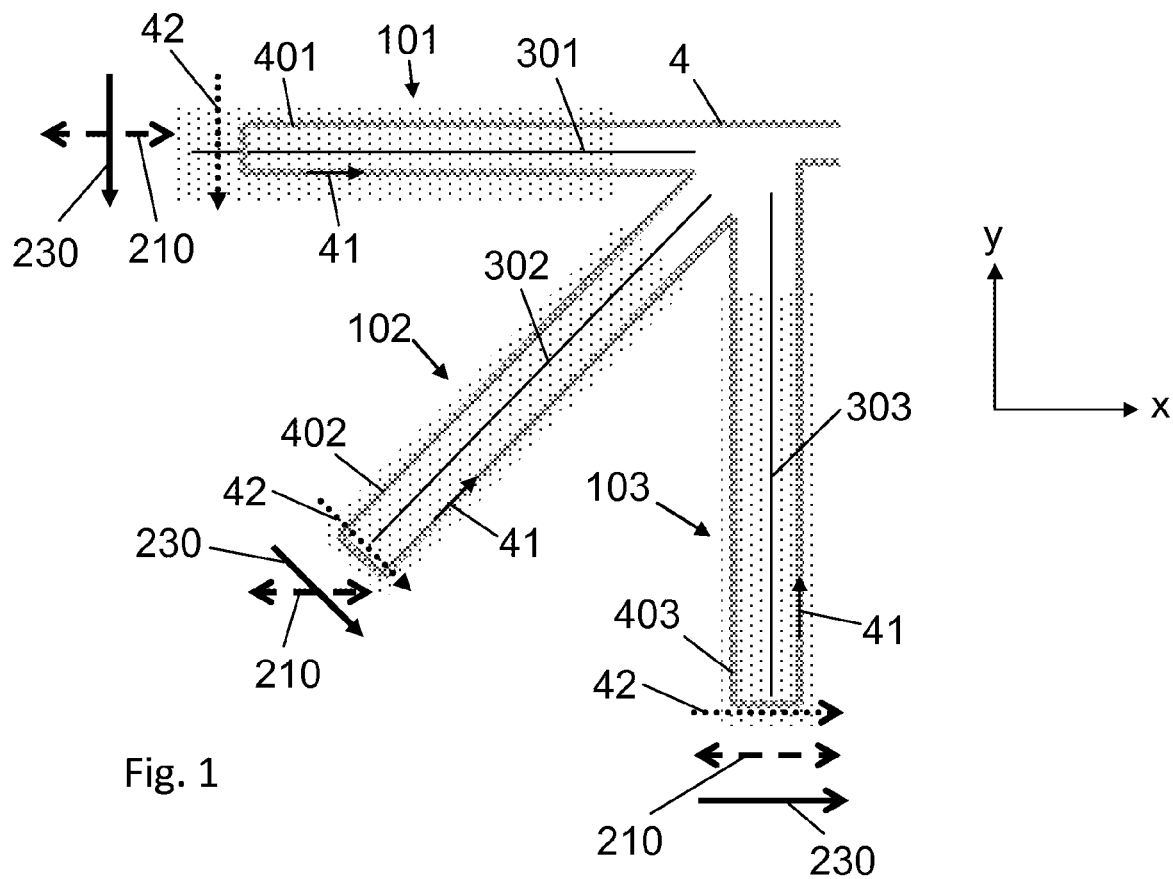
FIG. 1 illustrates a conventional MLU-based magnetic field direction measurement comprising a first, second and third branch comprising MLU cells.
Figure 2A:
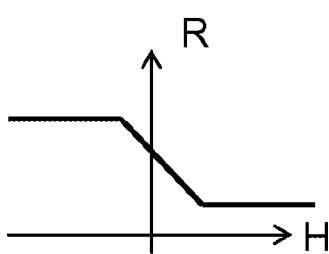
FIGS. 2a to 2c show hysteresis loops corresponding to the first branch (FIG. 2a), second branch (FIG. 2b) and third branch (FIG. 2c)
Figure 2B:
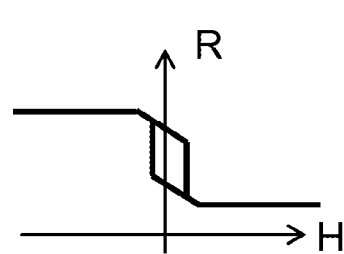
Figure 2C:
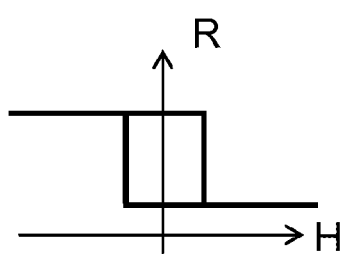
Figure 3:
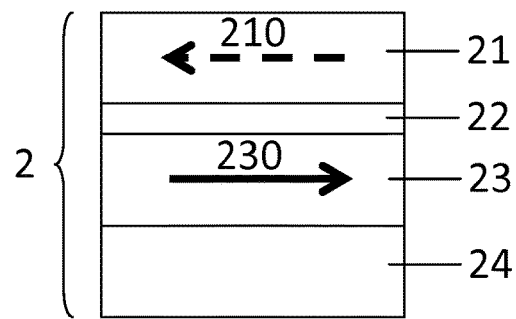
FIG. 3 shows a conventional MLU cell.
Figure 6:
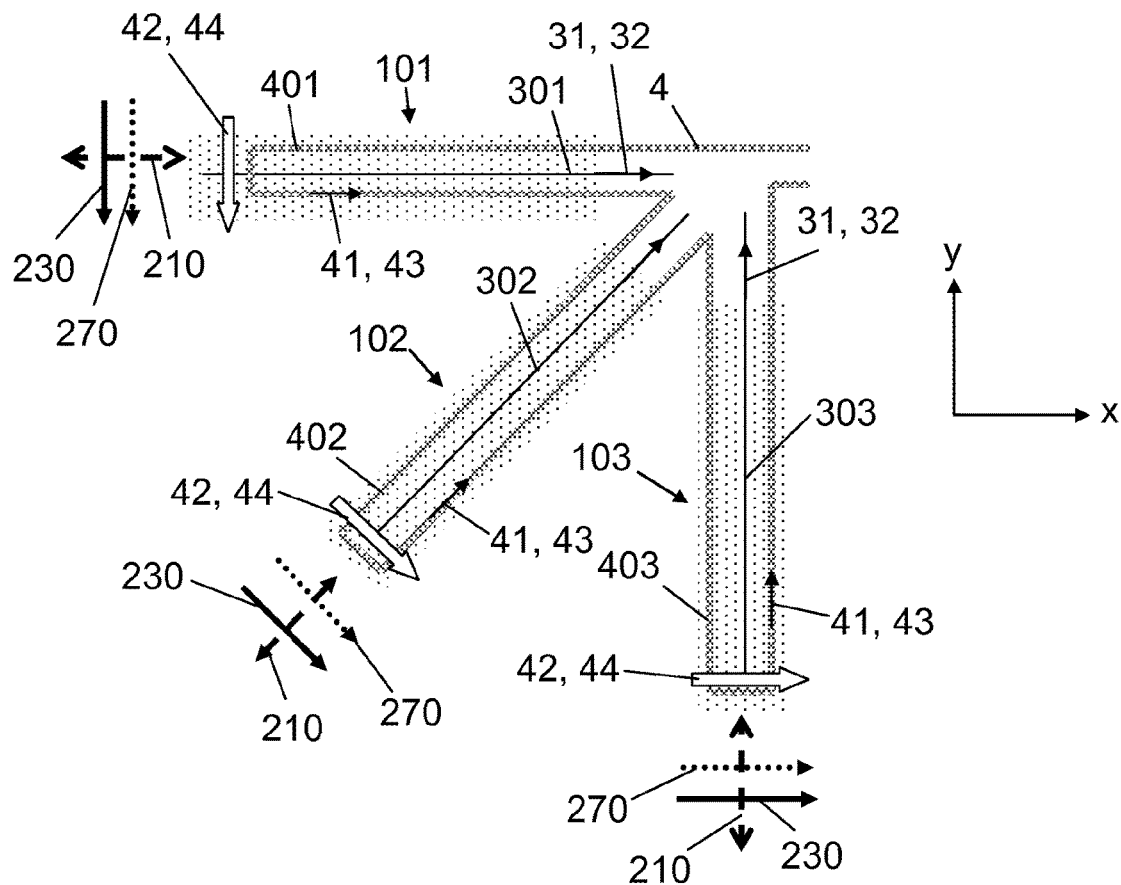
FIG. 6 illustrates a MLU-based magnetic field direction measurement device, according to an embodiment.

FIG. 6 illustrates an example of a magnetic sensor device 100 for measuring a magnetic field direction, according to an embodiment. The magnetic sensor device 100 includes a plurality of the MLU cells 1. The configuration of the magnetic sensor device 100 of FIG. 6 is similar to the one described in FIG. 1. The magnetic sensor device 100 comprises a plurality of branches 101, 102, 103 wherein each branch comprises a subset of the plurality of MLU cells 1 electrically connected in series to a current portion 301, 302, 303 of the current line 3, respectively. The magnetic sensor device 100 further comprises a programming line 4 configured for passing a programming field current 41 for inducing a programming magnetic field 42. The programming line comprises programming line portions 401, 402, 403, each programming line portions addressing a corresponding branch 101, 102, 103, respectively.

More particularly, each branch 101, 102, 103 includes an array comprising one or more rows and/or and columns of said plurality of MLU cells 1, electrically connected in series to one of the current lines 301, 302, 303. For example, each branch 101, 102, 103 can comprise one row of MLU cells 1 or two or more adjacent rows of MLU cells 1. The programming field current 41 can be passed individually in each programming line portion 401, 402, 403. Alternatively, the programming line portions 401, 402, 403 can be electrically connected in series such that the programming field current 41 is simultaneously passed in the programming line portions 401, 402, 403.

In the arrangement of FIG. 6, the magnetic sensor device 100 is represented having a first branch 101 oriented at angle of about 0° with respect to an axis x, a second branch 102 oriented at angle of about 45° and a third branch 103 oriented at angle of about 90° with respect to the axis x. A MLU cells comprised in the first, second and third branch 101, 102, 103 are addressed by a first, second and third programming line portion 401, 402, 403, respectively. The first, second and third programming line portions 401, 402, 403 are electrically connected in series such as to form a single programming line 4 in which the programming current 41 is passed.

The programming line portions 401, 402, 403 are configured such that the programming field current 41 flowing in any of the programming line portion 401, 402, 403 induce the programming magnetic field (shown by the white arrow 42) in a direction that is substantially perpendicular to the programming line portion 401, 402, 403 and to the branch 101, 102, 103.

Other configurations of the magnetic sensor device 100 can be contemplated. For example, the magnetic sensor device 100 can comprise a plurality of branches such that the average storage magnetization directions 230 of the MLU cells 1 substantially equally spaced by an angle of about 360 degrees divided by "n", where "n" can be 8, or about 45°.

According to an embodiment, a programming operation of the magnetic sensor device 100, comprises the steps of:

passing the heating current 31 in the current line 301, 302, 303 such as to heat the MLU cells 1 in the corresponding subset 101, 102, 103 at the high threshold temperature $T_H$ and unpin the reference and biasing magnetizations 230, 270 of said MLU cells 1;

applying a programming magnetic field 42 in the field line 401, 402, 403 for aligning the reference and biasing magnetization 230, 270 of said MRAM cells 1 in a programmed direction; and cooling the MLU cells 1 comprised in the corresponding subset 101, 102, 103 to the low threshold temperature $T_L$ such as to pin the switching the reference and biasing magnetizations 230, 270 in the programmed direction.

During the programming operation, the programming magnetic field 42 aligns both, the reference magnetization 230 and the biasing magnetization 270 of said MLU cells 1, in a programmed direction substantially perpendicular to the programming line portion 401, 402, 403. In FIG. 6, an average direction of the reference and biasing magnetizations 230, 270 for the MLU cells 1 comprised in the branch 101, 102, 103 being programmed is represented by the dotted arrows 230 and 270, respectively.

The magnetic coupling exerted between the biasing layer 27 and the sense layer 21 by the coupling layer 28 aligns the sense magnetization 210 in a direction substantially perpendicular to the programmed direction of the biasing magnetization 270. After the programming operation, once the MLU cells 1 comprised in all branches 101, 102, 103 have been programmed, the sense magnetization 210 is aligned substantially perpendicular to the reference magnetization 230, independently of the configuration of the branch 101, 102, 103. In the example of FIG. 6, an average direction of the sense magnetization, represented by the dashed arrows 210, is oriented substantially perpendicular to the reference magnetization 230 in the branch 101 at about 0°, at an angle of about 45° in the branch 102 at about 45°, and substantially parallel to the reference magnetization 230 in the branch 103 at about 90°.

The magnetic sensor device 100 comprising the MLU cells 1 of the invention can be programmed with the sense magnetization 210 being aligned substantially perpendicular to the direction of the reference magnetization 230, independently of the orientation of the configuration of the magnetic sensor device 100, such as the orientation of the branches 101, 102, 103, and of the pinning direction of the reference magnetization 230.

FIGS. 7a and 7b represent hysteresis loops measured with a vibrating sample magnetometer on the MLU cell 1 comprising a magnetic tunnel junction 2 including: "IrMn8/ CoFe1/NiFe1/IrMn1/NiFe2/Ta0.2/CoFeB2", where the numbers corresponds to the layer thicknesses in nm and where "CoFe/NiFe1" corresponds to the biasing layer 27 and "NiFe2/Ta0.2/CoFeB2" corresponds to the sense layer 21. The hysteresis loop of FIG. 7a was measured using a magnetic field H perpendicular to the programming field 42, or to an annealing field, (transverse magnetic field). The hysteresis loop of FIG. 7b was measured using a magnetic field H parallel to the programming field 42, or to an annealing field, (longitudinal magnetic field). The sense magnetization 210 presents a linear behavior when measured in the longitudinal direction as can be seen in FIG. 7b with the insert zooming on the linear portion of the hysteresis loops. Conversely, the sense magnetization 210 presents a hysteretic behavior when measured in the transverse direction as can be seen in FIG. 7a with the insert zooming on the hysteretic portion of the hysteresis loops.

FIGS. 8a and 8b is a top view of the magnetic tunnel junction 2 where the sense magnetization 210 is represented by the dashed arrow, the biasing magnetization by the plain arrow, the programming field 42 by the white arrow and the applied magnetic field H by the black arrow 60. FIG. 8a corresponds to the transverse magnetic field, as measured on FIG. 7a and FIG. 8b corresponds to the longitudinal magnetic field as measured on FIG. 7b.

In an embodiment, the steps of passing the heating current 31, applying a programming magnetic field 42 and cooling the MLU cells 1 are performed such that the branches 101, 102, 103 are programmed sequentially.

In another embodiment, the steps of passing the heating current 31, applying a programming magnetic field 42 and cooling the MLU cells 1 are performed such that each branch 101, 102, 103 are programmed simultaneously.

The programming magnetic field 42 is preferably applied at least until the MLU cells 1 in the subset have been cooled to the low threshold temperature $T_L$.

Figure 9A:
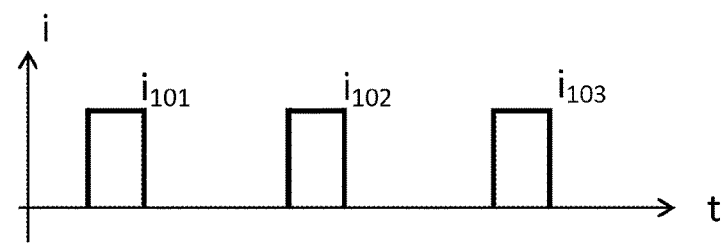
FIGS. 9a and 9b illustrate chronograms corresponding to the programming of the magnetic sensor device, showing the sequence of passing the heating current (FIG. 9a) and the sequence of applying a programming magnetic field (FIG. 9b); according to an embodiment.
Figure 9B:
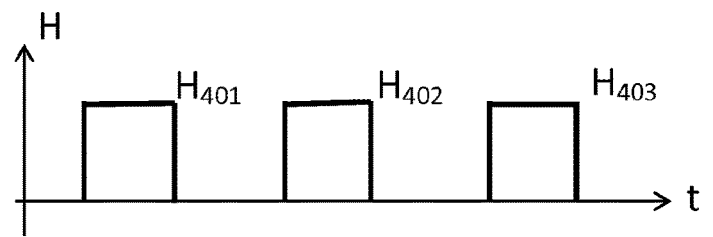

FIGS. 9a and 9b illustrate chronograms corresponding to the programming of the magnetic sensor device 100 comprising the first, second and third branches 101, 102, 103. In FIG. 9a, the sequence of passing the heating current 31 (indicated by symbol i in FIG. 9a) in the current line 301, 302, 303 is shown by the three current pulses $i_{101}$, $i_{102}$ and $i_{103}$ passed sequentially in the three branches 101, 102, 103, respectively. In FIG. 9b, the sequence of applying a programming magnetic field 42 (indicated by symbol H in FIG. 9b) in the programming line portions 401, 402, 403 is shown by the three programming field pulses $H_{401}$, $H_{402}$ and $H_{403}$ passed sequentially in the three programming line portions 401, 402, 403 addressing the branches 101, 102, 103, respectively. As shown in FIGS. 9a and 9b, the programming field pulses $H_{401}$, $H_{402}$, $H_{403}$ are longer than the current pulses $i_{101}$, $i_{102}$, $i_{103}$ such that the programming field 42 is applied until MLU cells 1 in the subset have been cooled to the low threshold temperature $T_L$.

According to an embodiment, a sensing operation of the magnetic sensor device 100, comprises passing a sensing current 32 in the current branches 301, 302, 303 such as to measure an average resistance R. Here, the average resistance R corresponds to the resistance measured in series for the MLU cells comprised in a branch 101, 102, 103. The resistance of each MLU cell is determined by the relative orientation of the sense magnetization 210 with respect to the reference magnetization 230. The sense magnetization 210 can be varied by passing a sense field current 43 in the programming line portions 401, 402, 403 such as to generate a sense magnetic field 44. The sense field current 43 can be alternated such as to modulate the sense magnetic field 44 and the average resistance R in accordance with the polarity of the sense field current 43. Since the sense magnetization 210 is initially substantially perpendicular to the reference magnetization 230, the response will be linear.

When the magnetic sensor device 100 is used for sensing an external magnetic field 60, such as the earth magnetic field, the sense magnetization 210 is aligned in the external magnetic field 60 in accordance with the respective orientation of the external magnetic field 60 and of the orientation of the branches 101, 102, 103 with respect to the direction of the external magnetic field 60. The external magnetic field 60 can be determined by passing a sensing current 32 in the current branches 301, 302, 303 such as to measure an average resistance R by passing the sensing current 32 in the current branches 301, 302, 303.

The MLU-based magnetic sensor device 100 disclosed herein may be included in, for example, a magnetometer and/or a compass.

In one embodiment, the magnetic sensor device 100 can be used for measuring a direction of an external magnetic field, such as the Earth's magnetic field, in two dimensions, e.g. a component of the external magnetic field in a two-dimensional plane. Devices incorporating design principles of the magnetic sensor device 100 may also measure a direction of the external magnetic field in three dimensions, such as by using the magnetic sensor device 100 with Hall effect vertical axis sensing. The Hall effect can result in a voltage difference (the Hall voltage) across an electrical conductor, transverse to an electric current in the conductor and a magnetic field perpendicular to the current. Based on the Hall effect, a component of the external magnetic field in the third dimension may be determined.

REFERENCE NUMBERS AND SYMBOLS

1 MLU cell
100 magnetic sensor device
101 first subset, first branch
102 second subset, second subset
103 third subset, third subset
2 magnetic tunnel junction
21 sense layer
210 sense magnetization
22 tunnel barrier layer
23 reference layer
230 reference magnetization
231 first reference ferromagnetic layer
232 second reference ferromagnetic layer
233 reference spacer layer
24 reference pinning layer
26 biasing pinning layer
27 biasing layer
270 biasing magnetization
271 first biasing ferromagnetic layer
272 second biasing ferromagnetic layer
273 biasing spacer layer
28 biasing coupling layer
29 non-magnetic spacer layer
3 current line
301 first current branch
302 second current branch
303 third current branch
31 heating current
32 sense current
4 programming line
401 programming line portion
402 programming line portion
403 programming line portion
41 programming field current
42 programming magnetic field
43 sense field current
44 sense magnetic field
60 external magnetic field
601 first component of external magnetic field
602 second component of external magnetic field
603 third component of external magnetic field
R average resistance
$T_H$ high threshold temperature
$T_L$ low threshold temperature
$T_{HP}$ high threshold temperature of the pinning layer
$T_{LP}$ low threshold temperature of the pinning layer

What is claimed is:

1. A magnetic logic unit (MLU) cell for sensing an external magnetic field, comprising a magnetic tunnel junction including a sense layer having a sense magnetization adapted to be oriented by the external magnetic field; a reference layer having a reference magnetization; a reference antiferromagnetic layer pinning the reference magnetization at a low threshold temperature and freeing the reference magnetization at a high threshold temperature; and a tunnel barrier layer between the sense layer and the reference layer;
   a biasing layer having a biasing magnetization and a biasing antiferromagnetic layer pinning the biasing magnetization at the low threshold temperature such that the pinned biasing magnetization is oriented substantially parallel to the pinned reference magnetization, and freeing the biasing magnetization at the high threshold temperature;
   a biasing coupling layer between the sense layer and the basing layer, the biasing coupling layer comprising a magnetic material of antiferromagnetic type and being configured for providing a magnetic coupling between the biasing layer and the sense layer such that the sense magnetization is oriented substantially perpendicular to the pinned biasing magnetization and to the pinned reference magnetization; and
   the magnetic tunnel junction further comprising a non-magnetic spacer layer between the sense layer and the biasing coupling layer, the non-magnetic spacer layer comprising one of: Ta, Mg, Al, Ru, Cu, Pt, Pd, Hf, Cr, Nb, Zn or any alloy or oxide containing any one of these elements, and being configured for tuning a strength of magnetic coupling of the biasing coupling layer.

2. The MLU cell according to claim 1, wherein the biasing layer comprises an antiferromagnetic material.

3. The MLU cell according to claim 2, wherein the antiferromagnetic material comprises any one of a combination of: FeMn, IrMn, PtMn, NiO, CoO, or any Mn or O based antiferromagnet such as CoFeO, NiFeO, or any Co, Fe, Ni or Mn based antiferromagnet.

4. The MLU cell according to claim 1, wherein the biasing layer is a synthetic ferromagnetic layer comprising a first ferromagnetic pinned layer and a second pinned ferromagnetic layer antiferromagnetically coupled by a spacer layer.

5. The MLU cell according to claim 1, wherein the sense layer is a synthetic ferromagnetic layer comprising a first ferromagnetic sense layer and a second ferromagnetic sense layer antiferromagnetically coupled by a sense spacer layer.

6. A magnetic sensor device for sensing an external magnetic field, comprising:
   a plurality of branches, each branch comprising a subset of a plurality of magnetic logic unit (MLU) cells, each MLU cell comprising a magnetic tunnel junction including a sense layer having a sense magnetization adapted to be oriented by the external magnetic field; a reference layer having a reference magnetization; a reference antiferromagnetic layer pinning the reference magnetization at a low threshold temperature and freeing the reference magnetization at a high threshold temperature; and a tunnel barrier layer between the sense layer and the reference layer;

a biasing layer having a biasing magnetization and a biasing antiferromagnetic layer pinning the biasing magnetization at the low threshold temperature and freeing the biasing magnetization at the high threshold temperature; the pinned biasing magnetization being oriented substantially parallel to the pinned reference magnetization; and a biasing coupling layer between the sense layer and the basing layer, the biasing coupling layer comprising a magnetic material of antiferromagnetic type and being configured for providing a magnetic coupling between the biasing layer and the sense layer such that the sense magnetization is oriented substantially perpendicular to the pinned biasing magnetization and to the pinned reference magnetization; the magnetic tunnel junction further comprising a non-magnetic spacer layer between the sense layer and the biasing coupling layer, the non-magnetic spacer layer comprising one of: Ta, Mg, Al, Ru, Cu, Pt, Pd, Hf, Cr, Nb, Zn or any alloy or oxide containing any one of these elements, and being configured for tuning a strength of magnetic coupling of the biasing coupling layer;

each subset being electrically connected in series by a current line configured for passing a programming current adapted for heating the MLU cells comprised in the subset above the high threshold temperature such as to free the reference magnetization and the biasing magnetization;

each branch further comprising a programming line configured for passing a programming field current inducing a programming magnetic field configured for aligning the reference magnetization and the biasing magnetization of the MLU cells comprised in the subset in a programmed direction, when the MLU cells are heated at the high threshold temperature.

7. The magnetic sensor device according to claim 6, wherein each subset being in communication with the programming field line.

8. The magnetic sensor device according to claim 6, wherein said plurality of branches comprises a first branch electrically connecting a first subset for sensing a first component of the external magnetic field, a second branch electrically connecting a second subset for sensing a second component of the external magnetic field, and a third branch electrically connecting a third subset for sensing a third component of the external magnetic field.

9. The magnetic sensor device according to claim 8, wherein the second branch is oriented at about 45° with respect to the first branch, and wherein the third branch is oriented substantially perpendicular to the first branch.

10. A method for programming a magnetic sensor device comprising a plurality of branches, each branch comprising a subset of a plurality of magnetic logic unit (MLU) cells;

each MLU cell comprising a magnetic tunnel junction including a sense layer having a sense magnetization adapted to be oriented by an external magnetic field; a reference layer having a reference magnetization; a reference antiferromagnetic layer pinning the reference magnetization at a low threshold temperature and freeing the reference magnetization at a high threshold temperature; and a tunnel barrier layer between the sense layer and the reference layer;

a biasing layer having a biasing magnetization and a biasing antiferromagnetic layer pinning the biasing magnetization at the low threshold temperature such that the pinned biasing magnetization is oriented substantially parallel to the pinned reference magnetization, and freeing the biasing magnetization at the high threshold temperature; and a biasing coupling layer between the sense layer and the basing layer, the biasing coupling layer comprising a magnetic material of antiferromagnetic type and being configured for providing a magnetic coupling between the biasing layer and the sense layer such that the sense magnetization is oriented substantially perpendicular to the pinned biasing magnetization and to the pinned reference magnetization; the magnetic tunnel junction further comprising a non-magnetic spacer layer between the sense layer and the biasing coupling layer, the non-magnetic spacer layer comprising one of: Ta, Mg, Al, Ru, Cu, Pt, Pd, Hf, Cr, Nb, Zn or any alloy or oxide containing any one of these elements, and being configured for tuning a strength of magnetic coupling of the biasing coupling layer;

each subset being electrically connected in series by a current line configured for passing a programming current adapted for heating the MLU cells comprised in the subset above the high threshold temperature such as to free the reference magnetization and the biasing magnetization;

each branch further comprising a programming line configured for passing a programming field current such as to apply a programming magnetic field configured for aligning the reference magnetization and the biasing magnetization of the MLU cells comprised in the subset in a programmed direction, when the MLU cells are heated at the high threshold temperature;

the method comprising:
  passing a heating current—in the current line such as to heat the MLU cells comprised in the corresponding subset at the high threshold temperature and unpin the reference magnetization and the biasing magnetization;
  once the MLU cells comprised in the subset are heated at the high threshold temperature, applying a programming magnetic field for aligning the reference magnetization and the biasing magnetization of the MLU cells comprised in the subset in a programmed direction;
  cooling the MLU cells comprised in the subset to the low threshold temperature such as to pin the reference magnetization and the biasing magnetization in the programmed direction, the sense magnetization being aligned substantially perpendicular to the programmed direction.

11. The method according to claim 10, wherein the steps of passing the heating current, switching the reference and biasing magnetization and cooling the MLU cells are performed such that each branch is programmed sequentially or simultaneously.

12. The method according to claim 10,
  wherein each subset is in communication with the programming field line; and
  wherein applying a programming magnetic field comprises passing a field current in the field line.

13. The method according to claim 10, wherein the programming magnetic field is applied at least until the MLU cells comprised in the subset have been cooled to the low threshold temperature.

14. A method for sensing an external magnetic field by using a magnetic sensor device comprising a plurality of branches, each branch comprising a subset of a plurality of magnetic logic unit (MLU) cells;

each MLU cell comprising a magnetic tunnel junction including a sense layer having a sense magnetization adapted to be oriented by the external magnetic field; a reference layer having a reference magnetization; a reference antiferromagnetic layer pinning the reference magnetization at a low threshold temperature and freeing the reference magnetization at a high threshold temperature; and a tunnel barrier layer between the sense layer and the reference layer; a biasing layer having a biasing magnetization and a biasing antiferromagnetic layer pinning the biasing magnetization at the low threshold temperature such that the pinned biasing magnetization is oriented substantially parallel to the pinned reference magnetization, and freeing the biasing magnetization at the high threshold temperature; and a biasing coupling layer between the sense layer and the basing layer, the biasing coupling layer comprising a magnetic material of antiferromagnetic type and being configured for providing a magnetic coupling between the biasing layer and the sense layer such that the sense magnetization is oriented substantially perpendicular to the pinned biasing magnetization and to the pinned reference magnetization; the magnetic tunnel junction further comprising a non-magnetic spacer layer between the sense layer and the biasing coupling layer, the non-magnetic spacer layer comprising one of: Ta, Mg, Al, Ru, Cu, Pt, Pd, Hf, Cr, Nb, Zn or any alloy or oxide containing any one of these elements, and being configured for tuning a strength of magnetic coupling of the biasing coupling layer;

each subset being electrically connected in series by a current line configured for passing a programming current adapted for heating the MLU cells comprised in the subset above the high threshold temperature such as to free the reference magnetization and the biasing magnetization;

each branch further comprising a programming line configured for passing a programming field current such as to apply a programming magnetic field configured for aligning the reference magnetization and the biasing magnetization of the MLU cells comprised in the subset in a programmed direction, when the MLU cells are heated at the high threshold temperature;

the method comprising passing a sensing current in the current lines.

15. The MLU cell according to claim 1, wherein the strength of the magnetic coupling of the biasing coupling layer is dependent on a thickness of the non-magnetic spacer layer, and the thickness of the non-magnetic spacer layer is less than 2 nm.

16. The magnetic sensor device according to claim 6, wherein the strength of the magnetic coupling of the biasing coupling layer is dependent on a thickness of the non-magnetic spacer layer, and the thickness of the non-magnetic spacer layer is less than 2 nm.

17. The method according to claim 10, wherein the strength of the magnetic coupling of the biasing coupling layer is dependent on a thickness of the non-magnetic spacer layer, and the thickness of the non-magnetic spacer layer is less than 2 nm.

18. The method according to claim 14, wherein the strength of the magnetic coupling of the biasing coupling layer is dependent on a thickness of the non-magnetic spacer layer, and the thickness of the non-magnetic spacer layer is less than 2 nm.

* * * * *